United States Patent
Kandori

(10) Patent No.: US 9,258,650 B2
(45) Date of Patent: Feb. 9, 2016

(54) CAPACITIVE ELECTROMECHANICAL TRANSDUCER

(75) Inventor: Atsushi Kandori, Ebina (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 145 days.

(21) Appl. No.: 13/271,168

(22) Filed: Oct. 11, 2011

(65) Prior Publication Data
US 2012/0103096 A1     May 3, 2012

(30) Foreign Application Priority Data

Nov. 2, 2010 (JP) ................................ 2010-245847

(51) Int. Cl.
| | |
|---|---|
| H02N 1/00 | (2006.01) |
| H04R 19/00 | (2006.01) |
| B06B 1/02 | (2006.01) |
| B81B 3/00 | (2006.01) |

(52) U.S. Cl.
CPC .............. *H04R 19/00* (2013.01); *B06B 1/0292* (2013.01); *B81B 3/0021* (2013.01)

(58) Field of Classification Search
CPC ......... H02N 1/00; H04R 19/00; G01N 29/04; B81B 3/0021; B06B 1/0292
USPC ......................... 324/650, 660–663, 671, 686; 345/173–174; 73/74, 335.04; 340/545.4, 562, 870.37; 702/47, 52
See application file for complete search history.

(56) References Cited

U.S. PATENT DOCUMENTS

| | | | |
|---|---|---|---|
| 6,430,107 B1 | 8/2002 | Meier | 367/131 |
| 6,430,109 B1 | 8/2002 | Khuri-Yakub et al. | |
| 6,989,677 B2 * | 1/2006 | Morimoto | 324/660 |
| 7,121,147 B2 * | 10/2006 | Okada | 73/760 |
| 7,141,989 B1 * | 11/2006 | Liu | 324/661 |
| 7,149,442 B2 | 12/2006 | Ushijima et al. | 399/48 |
| 7,382,137 B2 | 6/2008 | Ushijima et al. | 324/458 |
| 7,741,851 B2 | 6/2010 | Ushijima et al. | 324/458 |
| 8,176,780 B2 | 5/2012 | Takagi et al. | 73/504.14 |
| 2003/0122206 A1 * | 7/2003 | Bhattarai et al. | 257/415 |
| 2004/0085078 A1 * | 5/2004 | Katou et al. | 324/661 |
| 2005/0200241 A1 * | 9/2005 | Degertekin | 310/334 |

(Continued)

FOREIGN PATENT DOCUMENTS

JP     2010-508888 A     3/2010

OTHER PUBLICATIONS

U.S. Appl. No. 13/508,344, filed May 4, 2012 by Atsushi Kandori et al.

*Primary Examiner* — Arleen M Vazquez
*Assistant Examiner* — Robert P Alejnikov, Jr.
(74) *Attorney, Agent, or Firm* — Fitzpatrick, Cella, Harper & Scinto

(57) ABSTRACT

A capacitive electromechanical transducer in which a reception characteristic is hardly affected by an elastic wave intruding into a substrate is provided. The capacitive electromechanical transducer includes a first electric connection portion that is connected to a second electrode disposed on a surface of a substrate to draw the second electrode onto a side of a surface of the first substrate on a side opposite from a surface in which a first electrode and the second electrodes are provided. With respect to a thickness direction of a first substrate, a diaphragm with which the first electric connection portion is covered is formed on the side of the surface of the first substrate, in which the first and second electrodes are provided.

16 Claims, 7 Drawing Sheets

(56) References Cited

U.S. PATENT DOCUMENTS

| | | | |
|---|---|---|---|
| 2008/0191956 A1* | 8/2008 | Watanabe | 343/841 |
| 2008/0264167 A1 | 10/2008 | Kandori et al. | 73/504.12 |
| 2009/0193893 A1 | 8/2009 | Kandori et al. | 73/504.12 |
| 2009/0211891 A1* | 8/2009 | Lai et al. | 200/512 |
| 2010/0168583 A1 | 7/2010 | Dausch et al. | |
| 2010/0213791 A1 | 8/2010 | Kandori et al. | 310/309 |
| 2010/0259127 A1 | 10/2010 | Zaitsu et al. | |
| 2011/0031568 A1 | 2/2011 | Kandori et al. | 257/419 |
| 2011/0169510 A1 | 7/2011 | Kandori et al. | 324/686 |
| 2012/0194107 A1 | 8/2012 | Kandori et al. | 318/116 |

* cited by examiner

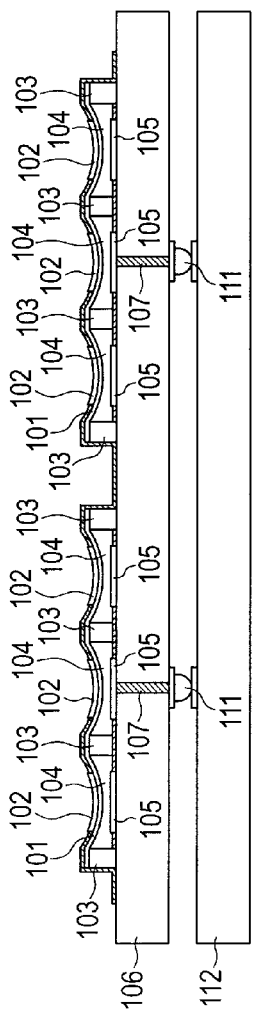
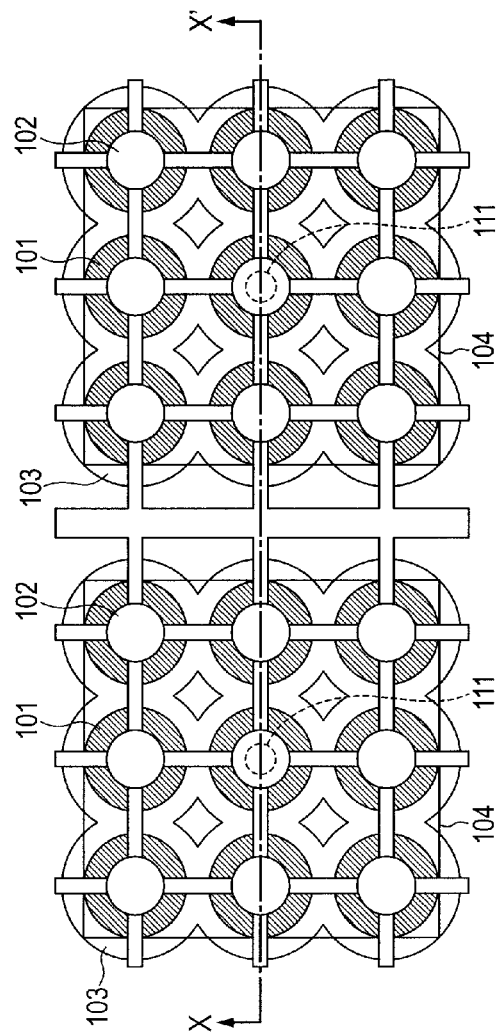
FIG. 1A
FIG. 1B

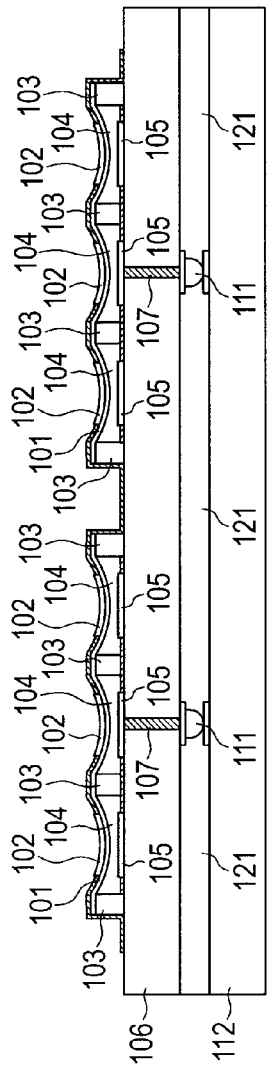
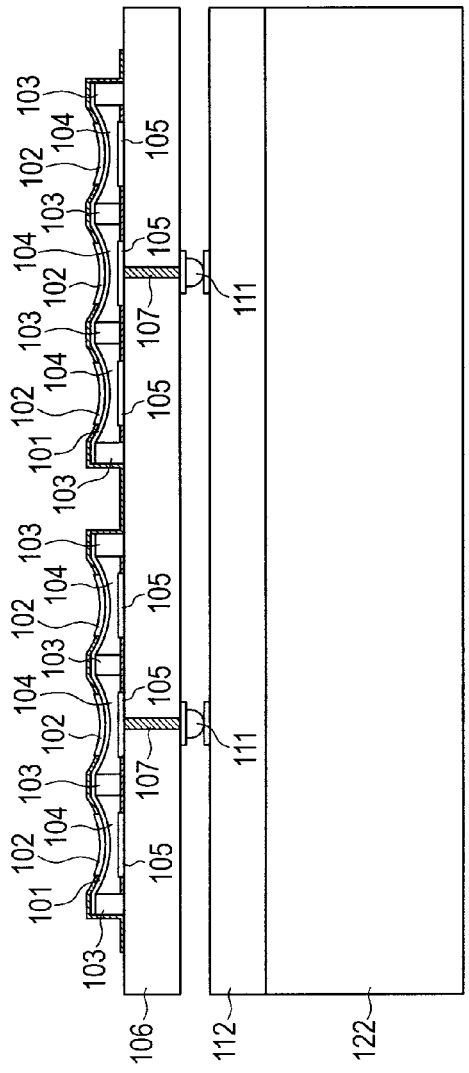

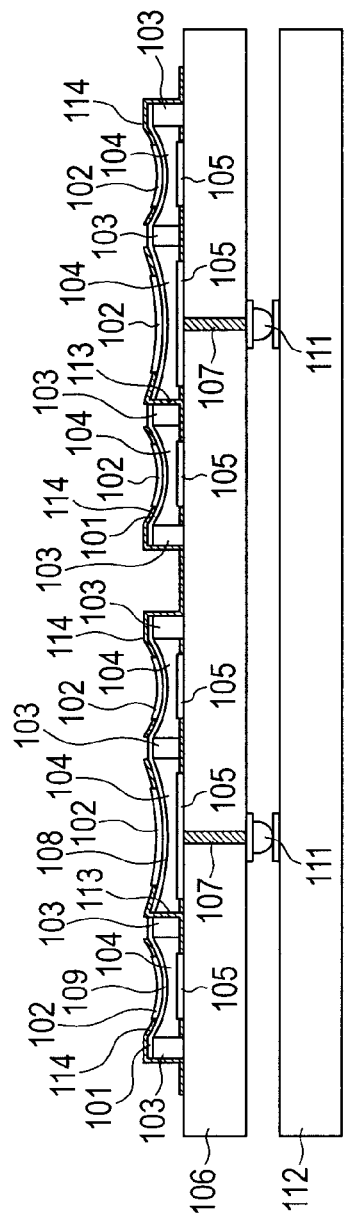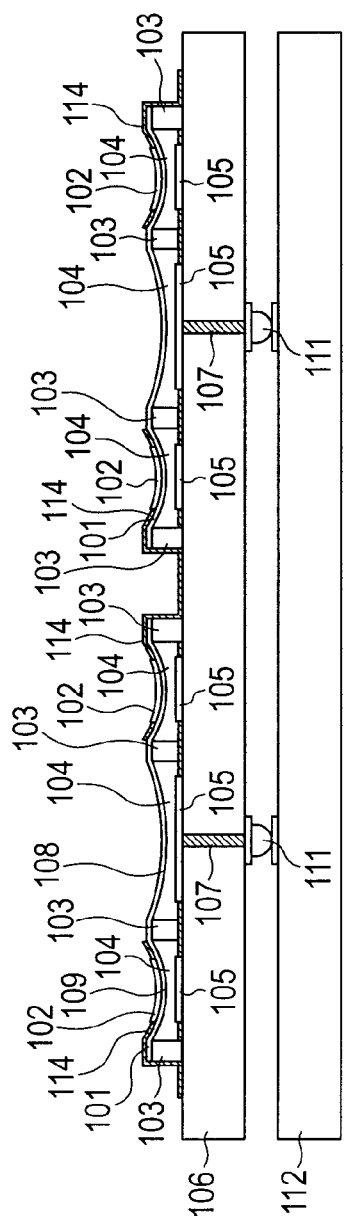

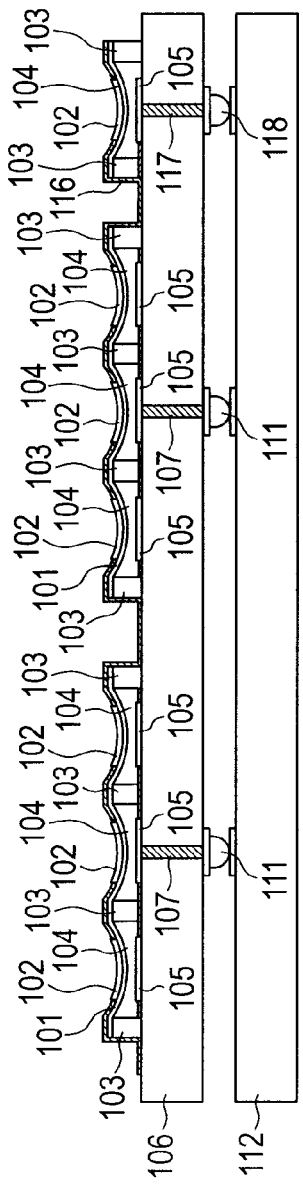
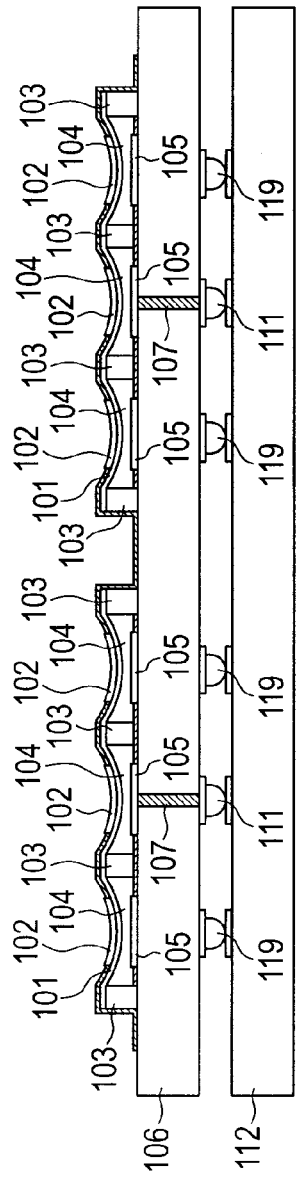

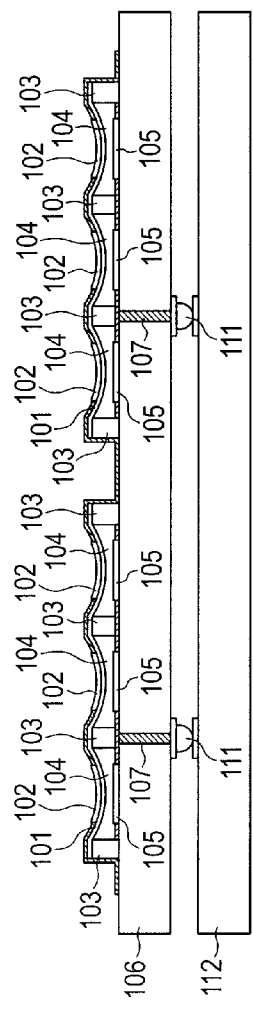
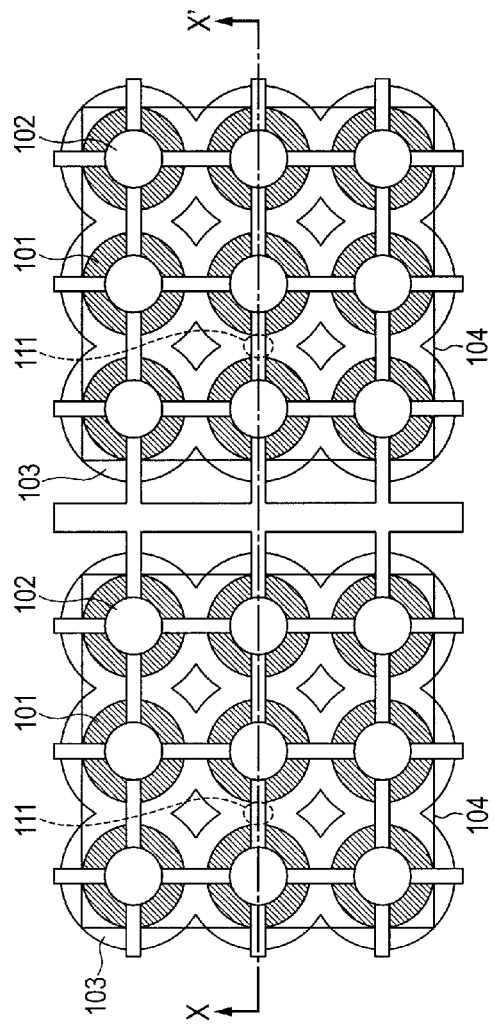
FIG. 8A
FIG. 8B

CAPACITIVE ELECTROMECHANICAL TRANSDUCER

BACKGROUND OF THE INVENTION

1. Field of the Invention

The present invention relates to a capacitive electromechanical transducer that receives an elastic wave such as an ultrasound.

2. Description of the Related Art

A Capacitive-Micromachined-Ultrasonic-Transducer (CMUT) that is of a capacitive ultrasonic transducer is proposed as a transducer that receives an ultrasound. CMUT is prepared using a MEMS (Micro-Electro-Mechanical Systems) to which a semiconductor process is applied. FIG. 8B is a top plan view illustrating a two-dimensional-array CMUT of the related art, and FIG. 8A is a sectional view taken on a line X-X' of FIG. 8B. In FIGS. 8A and 8B, reference numerals 101, 102, 103, 104, 105, 106, 107, 111, and 112 show a diaphragm, a first electrode (upper electrode), a diaphragm support, an air gap, a second electrode (lower electrode), a first substrate, a through line, an electric connection portion, and a second substrate, respectively (see U.S. Pat. No. 6,430,107).

In the CMUT, the first electrode 102 is formed on the diaphragm 101, and the diaphragm 101 is supported by the diaphragm support 103 formed on the first substrate 106. The first electrode 102, which is formed on the diaphragm 101, and the second electrode 105, which is opposite the first electrode 102 with the air gap 104 (usually, thickness of tens nanometers to hundreds nanometers) interposed therebetween, are disposed on the first substrate 106. Hereinafter, in the first substrate 106, a surface in which the CMUT is formed is referred to as a CMUT formation surface, and a surface on the opposite side is referred to as a CMUT non-formation surface. FIGS. 8A and 8B illustrate a state in which the diaphragm 101 is slightly yielded onto a side of the substrate 106 by an external force. A set of the diaphragm 101, the air gap 104, and the two electrodes 102 and 105 that are opposite each other with the air gap 104 interposed therebetween is called a cell. Plural cells (usually, 100 to 3000 cells) to which the first and the second electrodes 102 and 105 are connected is called an element as a unit in which the ultrasound is transmitted and received. The first substrate 106 includes the plural through lines 107, and lines of the first or second electrodes on the CMUT formation surface are drawn to the CMUT non-formation surface through the through lines 107. The drawn lines are connected to the second substrate 112 through the electric connection portion 111. The second substrate 112 is a Printed-Circuit-Board (PCB) including a multilayer line or a signal processing chip. In the second substrate 112, elements of the two-dimensionally arrayed CMUTs are connected to a detection circuit or a power supply.

SUMMARY OF THE INVENTION

In the above CMUT, an ultrasound that reaches an area where the diaphragm 101 is not formed is reflected on a substrate surface according to a characteristic acoustic impedance (Z1) of the first substrate 106 and a characteristic acoustic impedance (Z0) of a medium through which the ultrasound travels. The residual ultrasound that is not reflected on the board surface intrudes into the first substrate 106 and travels through the first substrate 106 to the CMUT non-formation surface of the first substrate 106. In the CMUT non-formation surface of the first substrate 106, the ultrasound is reflected according to a value of the characteristic acoustic impedance of the first substrate 106 and a value (Z2) of a characteristic acoustic impedance of a substance that is in contact with the CMUT non-formation surface. The ultrasound reflected on the CMUT non-formation surface travels toward the CMUT formation surface and has an influence on a change of capacitance between the electrodes through the diaphragm support 103 of the CMUT and the second electrode (lower electrode) 105. Therefore, there is a deviation from the change of capacitance, which is originally generated by oscillation of the diaphragm 101 when the diaphragm 101 receives the ultrasound, thereby generating a risk of degrading a reception characteristic of the CMUT.

In light of the above-mentioned problem, a capacitive electromechanical transducer according to the invention has the following features. The capacitive electromechanical transducer includes a first electrode and a second electrode that is disposed on a surface of a first substrate while being opposite the first electrode with a gap interposed therebetween. In the capacitive electromechanical transducer, the first electrode oscillates by receiving an elastic wave, thereby performing at least a reception operation for receiving the elastic wave. The capacitive electromechanical transducer also includes a first electric connection portion that is connected to the second electrode to draw the second electrode to a surface side of the first substrate on a side opposite from a surface in which the first and second electrodes are provided. With respect to a thickness direction of the first substrate, a diaphragm with which the first electric connection portion is covered is formed on the surface side of the first substrate, in which the first and second electrodes are provided.

According to the capacitive electromechanical transducer of the invention, because the diaphragm to cover the first electric connection portion is formed, the reception characteristic is hardly affected by the elastic wave intruding into the first substrate.

Further features of the present invention will become apparent from the following description of exemplary embodiments with reference to the attached drawings.

BRIEF DESCRIPTION OF THE DRAWINGS

FIG. 1A is a sectional view illustrating a capacitive electromechanical transducer according to a first embodiment.

FIG. 1B is a top plan view illustrating the capacitive electromechanical transducer according to the first embodiment.

FIG. 2A is a sectional view illustrating a modification according to the first embodiment.

FIG. 2B is a sectional view illustrating another modification according to the first embodiment.

FIG. 4A is a sectional view illustrating a capacitive electromechanical transducer according to a third embodiment.

FIG. 4B is a sectional view illustrating a modification of the capacitive electromechanical transducer according to the third embodiment.

FIG. 5 is a sectional view illustrating a capacitive electromechanical transducer according to a fourth embodiment.

FIG. 6 is a sectional view illustrating a capacitive electromechanical transducer according to a fifth embodiment.

FIG. 8A is a sectional view illustrating a capacitive electromechanical transducer of the related art.

FIG. 8B is a plan view illustrating the capacitive electromechanical transducer of the related art.

DESCRIPTION OF THE EMBODIMENTS

Figure 3A:
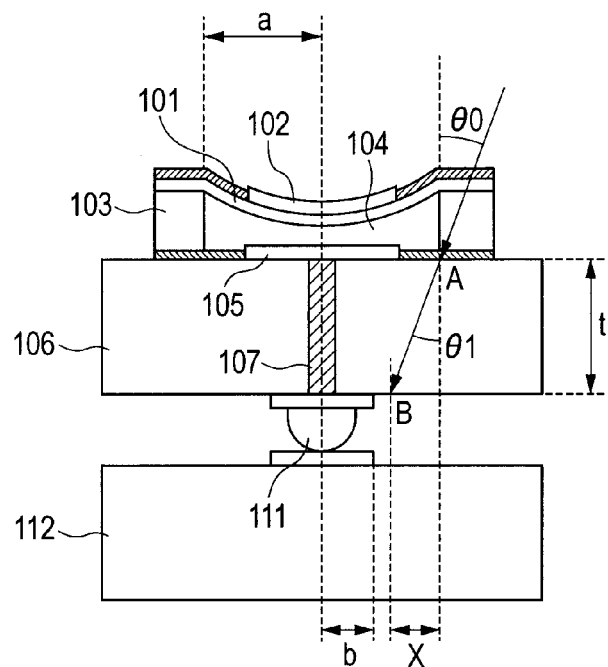
FIG. 3A is a view illustrating a capacitive electromechanical transducer according to a second embodiment.

Preferred embodiments of the present invention will now be described in detail in accordance with the accompanying drawings.

One of the features of the invention is that attention is paid to the reflection of the elastic wave intruding into the substrate in the electric connection portion and, with respect to the thickness direction of the substrate, an area where the electric connection portion is formed is covered with an area where the diaphragm is formed. Because the elastic wave is typically an ultrasound, the elastic wave is represented by an expression of an ultrasound in the following description. A phrase of "with respect to a thickness direction of a substrate" means "when viewed from the thickness direction". For example, in FIG. 1A, the phrase of "with respect to a thickness direction of a substrate" means that the capacitive electromechanical transducer is viewed from the upside. In the invention, the diaphragm means an area of an oscillatable film provided on a gap. In FIG. 1A, since a portion of the film that is formed on a diaphragm support 103 supporting the diaphragm does not oscillate while being fixed to the diaphragm support 103, the portion is not included in the diaphragm of the invention.

When the electric connection portion is covered as above, an advantageous effect as described below can be realized. The ultrasound that reaches the diaphragm oscillates the diaphragm and the first electrode (upper electrode) to generate a change of capacitance between the first electrode and the second electrode (lower electrode). A detection circuit detects the change of capacitance using an electric signal (current) output from the first or second electrode, thereby detecting the ultrasound. Usually an air gap between the diaphragm and the second electrode (lower electrode) is maintained in vacuum or at reduced pressure. Therefore, even if the diaphragm oscillates, the oscillation of the diaphragm is not prevented by damping caused by a gas in the air gap. A spring characteristic of the diaphragm is set such that the diaphragm oscillates sufficiently according to magnitude of the input ultrasound. Therefore, the diaphragm can oscillate sensitively in response to an external pressure. The ultrasound that reaches the diaphragm is substantially absorbed by the diaphragm with little reflection. Consequently, when the first electric connection portion is covered as described above, a small amount of ultrasound reaches the electric connection portion, so that an influence of a reflected wave of the ultrasound in the electric connection portion can be reduced.

First Embodiment

In FIG. 1B, which is a top plan view illustrating a capacitive electromechanical transducer according to a first embodiment that performs a reception operation, and FIG. 1A, which is a sectional view taken on a line X-X' of FIG. 1B, the same components as those of FIGS. 8A and 8B are shown by the same reference numerals. While an expression of the air gap is used in the following description, an air gap 104 may be a gap in which air or another gas exists at an atmospheric pressure or less, and it is not always necessary that the air gap is a space in which the air exists. The first embodiment has the substantially same configuration as that of FIGS. 8A and 8B except the following points. Hereinafter, with respect to a second substrate 112, a surface on a side of a first substrate 106 is referred to as an upper surface and a surface on the opposite side is referred to as a lower surface.

In the first embodiment, a metallic bump such as a solder bump and a gold bump can be used as a first electric connection portion 111. When the metallic bump is used, a resistance of connection between the first substrate 106 and the second substrate 112 can be decreased and reliability of a connection portion can be secured. The electric connection portion 111 is connected to a through line 107 that pierces the first substrate 106, and the electric connection portion 111 connects a line on the side of the surface of the first substrate 106, in which surface first and second electrodes 102 and 105 that are opposite each other are not provided, to the second substrate 112. In the first embodiment, with respect to the thickness direction of the first substrate 106, an area where the electric connection portion 111 is disposed is completely covered with an area where a diaphragm 101 is formed (see FIG. 1B).

In the above configuration, the reflection of the ultrasound intruding into the first substrate 106 is discussed. An amount of ultrasound that transmitted and reflected at an interface between different substances depends on the characteristic acoustic impedances of the substances. Specifically, a rate of the reflection is increased with increase of the difference between the characteristic acoustic impedances of the two substances, and the rate of reflection is decreased with decrease of the difference between the characteristic acoustic impedances. At this point, it is assumed that Z1 is a characteristic acoustic impedance of the first substrate 106 while Z0 is a characteristic acoustic impedance of a medium through which the ultrasound travels. A rate r1 at which the ultrasound is reflected by the CMUT formation surface of the first substrate 106 can be expressed by the following equation (1).

$$r1 = (Z0 - Z1)/(Z0 + Z1) \quad \text{equation (1)}$$

On the other hand, a rate T1 at which the ultrasound intrudes into (is transmitted through) the first substrate 106 can be expressed by the following equation (2).

$$T1 = 2 \times Z0/(Z0 + Z1) \quad \text{equation (2)}$$

Usually single-crystal materials such as silicon or glass is used as the first substrate 106 on which the CMUT is formed. The single-crystal silicon has the characteristic acoustic impedance of about 20 [MRayl] and the glass has the characteristic acoustic impedance of about 10 to 20 [MRayl]. On the other hand, the solder has the characteristic acoustic impedance of about 40 to 50 [MRayl]. The ultrasound, which intrudes into the first substrate 106 and reaches the CMUT non-formation surface of the first substrate 106 on which the electric connection portion 111 exists, is reflected by the difference between the characteristic acoustic impedances. The reflected ultrasound affects the reception characteristic of the CMUT to degrade performance.

In the first embodiment, attention is paid to the fact that the ultrasound intruding into the first substrate 106 intrudes from an area where the diaphragm 101 is not formed and goes straight. It can be regarded that the ultrasound hardly intrudes into the first substrate 106 from an area where the diaphragm 101 is formed. Therefore, the area where the electric connection portion 111 is disposed is completely covered with the area where the diaphragm 101 is formed, which allows the decrease in rate at which the ultrasound intruding into the first substrate 106 reaches the CMUT non-formation surface of the first substrate 106 and the electric connection portion 111. Since the amount of ultrasound that invades into the first substrate 106 to reach the electric connection portion 111 can be decreased, the amount of ultrasound that is reflected by the CMUT non-formation surface and the electric connection portion 111 can significantly be suppressed. Therefore, the influence of the ultrasound that intrudes into the first substrate 106 and is reflected by the electric connection portion 111 to affect the reception characteristic can be reduced. Accordingly, the use of the configuration of the first embodiment can provide the capacitive electromechanical transducer (such as the CMUT) having the reception characteristic that is hardly affected by the ultrasound intruding into the substrate.

Metal such as copper and silicon in which a resistance value is decreased by doping an impurity can be used as a through line 107 of the first embodiment. Sometimes the reflection of the ultrasound intruding into the substrate is generated by the difference between the characteristic acoustic impedance of the through line 107 and the characteristic acoustic impedance of the first substrate 106. With respect to the thickness direction of the first substrate 106, preferably an area where the through line 107 is disposed is completely covered with the area where the diaphragm 101 is formed. Therefore, the influence of the ultrasound that intrudes into the first substrate 106 and is reflected by the through line 107 to affect the reception characteristic can be reduced. The use of the configuration can reduce the degradation of the reception characteristic, which is caused by the ultrasound intruding into the substrate.

As a modification of the first embodiment, as illustrated in FIG. 2A, there is a preferable configuration in which an inter-substrate filling substance 121 is disposed in the area where the electric connection portion 111 is not disposed between the first substance 106 and the second substrate 112. The inter-substrate filling substance 121 is selected in consideration of the characteristic acoustic impedances of the first substrate 106 and the second substrate 112. Specifically, the substance, with which the ultrasound intruding into the substrate is hardly reflected by the CMUT non-formation surface of the first substrate 106 and the ultrasound is hardly reflected on the upper surface of the second substrate 112, is used as the inter-substrate filling substance 121. That is, the substance having the characteristic acoustic impedance between the characteristic acoustic impedances of the first substrate 106 and the second substrate 112 may be used as the inter-substrate filling substance. Since the small amount of ultrasound is reflected by the area where the electric connection portion 111 is not disposed at the interface between the first substrate 106 and the second substrate 112 with this configuration, it can further reduce the influence of the ultrasound that intrudes into the first substrate 106 on the reception characteristic. Therefore, the reception characteristic in which the degradation caused by the ultrasound intruding into the substrate is further reduced can be obtained. Additionally, the use of the inter-substrate filling substance 121 can advantageously improve mechanical strength between the first substrate 106 and the second substrate 112.

As to another modification of the first embodiment, as illustrated in FIG. 2B, an elastic wave damping substance 122 can be disposed on the lower surface of the second substrate 112 as necessary. The characteristic acoustic impedance of the elastic wave damping substance 122 is selected in consideration of the characteristic acoustic impedance of the second substrate 112. Specifically, the substance, in which the ultrasound intruding into the substrate is hardly reflected on a contact surface (the lower surface of the second substrate 112) between the second substrate 112 and the elastic wave damping substance 122, is used as the elastic wave damping substance 122. Specifically, the substance having the characteristic acoustic impedance close to that of the second substrate 112 is used as the elastic wave damping substance 122. Preferably the substance that damps the ultrasound at a frequency to be transduced by the capacitive electromechanical transducer is used as the elastic wave damping substance 122.

A damping rate and a thickness of the elastic wave damping substance 122 are set to values that do not affect the reception characteristic of the capacitive electromechanical transducer. Specifically, the damping rate and the thickness are set such that the ultrasound intruding into the substrate is sufficiently damped until the ultrasound is reflected on a rear surface of the elastic wave damping substance 122, which is not in contact with the second substrate 112, and returns into the capacitive electromechanical transducer again.

The use of the configuration can largely reduce the influence of the ultrasound traveling from the first substrate 106 to the second substrate 112 on the reception characteristic. Therefore, the capacitive electromechanical transducer having the reception characteristic that is further hardly degraded by the ultrasound intruding into the substrate can be provided.

Second Embodiment

Figure 3B:
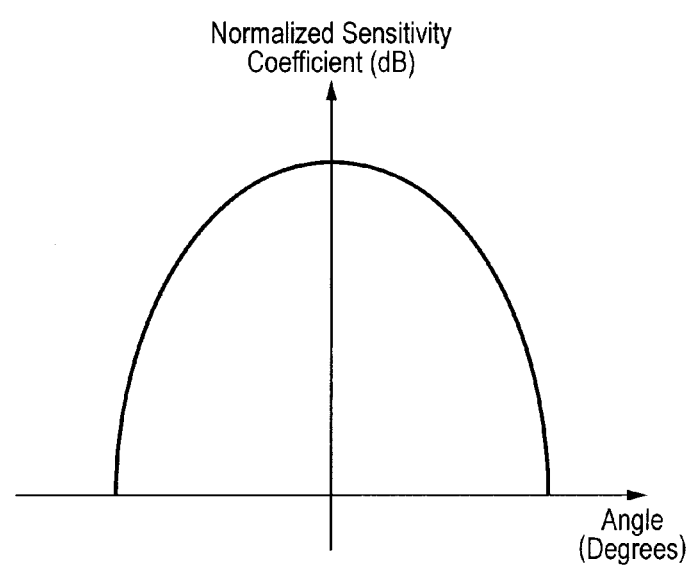
FIG. 3B is a view illustrating a directive characteristic of a CMUT with respect to an incident angle of an ultrasound.

In a second embodiment, a relationship of a size of a diaphragm 101 and a size of an electric connection portion 111 will be represented with reference to FIGS. 3A and 3B. Other configurations of the second embodiment are identical to those of the first embodiment. In the second embodiment, the relationship of the size of the diaphragm 101 and the size of the electric connection portion 111 is defined by an incident angle of the ultrasound to the CMUT.

As illustrated in FIG. 3A, it is assumed that $\theta 0$ is an angle at which the ultrasound is incident. It is further assumed that the diaphragm 101 is formed into a circular shape having a radius "a", the electric connection portion 111 is formed into a circular shape having a radius "b", and a first substrate 106 has a thickness "t". At this point, a center of the diaphragm 101 is matched with a center of the electric connection portion 111. It is assumed that C1 is a sound velocity of a substance that exists in an area where the ultrasound travels to the CMUT, and C2 is a sound velocity of the first substrate 106. In this case, the ultrasound that is incident to a point A of the first substrate 106 at the angle $\theta 0$ is refracted when intruding into the first substrate 106, and the ultrasound travels through the first substrate 106 at an angle $\theta 1$ expressed by the following equation (3).

$$\theta 1 = \sin^{-1}(C2/C1 \times \sin(\theta 0)) \qquad \text{equation (3)}$$

The ultrasound intrudes into the first substrate 106 at the angle $\theta 1$ and reaches a point B existing on the CMUT non-formation surface of the first substrate 106. The ultrasound intruding from the point A on the CMUT formation surface of the first substrate 106 exists at the point B when reaching the CMUT non-formation surface of the first substrate 106, namely, the ultrasound moves in a direction perpendicular to the thickness direction of the first substrate 106. A moving amount X of the ultrasound can be expressed by the following equation (4).

$$X = t \times \tan \theta 1 \qquad \text{equation (4)}$$

In the case that the incident ultrasound has the angle, because the position of the ultrasound moved until the ultrasound reaches the CMUT non-formation surface of the first substrate 106, preferably the movement of the position is taken into account in designing the configuration in which the electric connection portion 111 is covered with the diaphragm 101. In consideration of the movement of the position, a preferable relationship among the movement amount X, the size "a" of the diaphragm 101, and the size "b" of the electric connection portion 111 can be expressed by the following expression (5).

$$X < (a - b) \qquad \text{expression (5)}$$

Preferably the relationship between the size a of the diaphragm 101 and the size b of the electric connection portion 111 is expressed by the following expression (6) based on the equation (4) and the expression (5).

$$a > b + t \times \tan(\theta 1) \quad \text{expression (6)}$$

The relationship between the size "a" of the diaphragm 101 and the size b of the electric connection portion 111 is expressed by an expression (7) based on the equations (3) and the expression (6).

$$a > b + t \times \tan(\sin^{-1}(C2/C1 \times \sin(\theta 0))) \quad \text{expression (7)}$$

When the relationship between the size a of the diaphragm 101 and the size b of the electric connection portion 111 is expressed by the expression (7), the ultrasound intruding into the substrate hardly reaches the electric connection portion 111 even if the incident ultrasound has the angle. According to the second embodiment, the capacitive electromechanical transducer (such as the CMUT) having the reception characteristic that is hardly affected by the ultrasound intruding into the substrate can be provided even if the incident ultrasound has the angle.

As to a modification of the second embodiment, the angle $\theta 0$ at which the ultrasound is incident can be set to a value in consideration of a directive characteristic of the CMUT. The CMUT has a reception sensitivity characteristic in which the reception sensitivity is degraded depending on the incident angle of the ultrasound, i.e. directive characteristic. When the angle $\theta$ changes, a ratio $R\theta$ of the reception sensitivity to the maximum reception sensitivity can be expressed by the following equation (8) by a width W (at this point, it is assumed that the element has a square shape) of an element and a wavelength $\lambda$ at a receiving frequency. FIG. 3B illustrates an example of the state in which the equation (8) changes.

$$R\theta = |\sin(k \times W/2 \times \sin\theta)/(k \times W/2 \times \sin\theta)| \quad \text{equation (8)}$$

(where $k = 2\pi/\lambda$)

Since the reception characteristic is degraded when the incident angle $\theta$ is increased to decrease the ratio of the reception sensitivity, a large incident angle $\theta$ is usually avoided in the actual measurement. When a CMUT is used, in consideration of the directive characteristic, the equation (8) is used up to a maximum incident angle $\theta$max at which the elastic wave is used in the first substrate 106. Using the maximum incident angle $\theta$max, the size of the diaphragm 101 and the size of the electric connection portion 111 can be expressed by the following expression (9).

$$a > b + t \times \tan(\sin^{-1}(C2/C1 \times \sin(\theta max))) \quad \text{expression (9)}$$

The relationship expressed by the expression (9) can obtain the reception characteristic that is hardly degraded by the ultrasound intruding into the substrate even if the incident ultrasound has the maximum angle in the angle range of the actual use.

Third Embodiment

In a third embodiment, a diaphragm 101 with which an electric connection portion 111 is covered will be described with reference to FIGS. 4A and 4B. Other configurations of the third embodiment are identical to those of one of the first and second embodiments. The diaphragm 101 disposed in the element can be divided into a diaphragm 108 on the electric connection portion 111 and a diaphragm 109 except the diaphragm 108. In the third embodiment, the size of the diaphragm 108 on the electric connection portion 111 differs from the size of the diaphragm 109 except the diaphragm 108.

Specifically, the diaphragm 108 on the electric connection portion 111 has the size suitable to cover the electric connection portion 111 therewith as described in the first and second embodiments. On the other hand, the diaphragm 109 except the diaphragm 108 has the size suitable to receive the ultrasound. The sizes of the diaphragms 108 and 109 are set by the frequency of the received signal, the materials and the shapes of the diaphragms 108 and 109, and a height of the air gap. Since the diaphragm 108 is set such that the ultrasound intruding into the substrate becomes optimum (that is, reduced), even if the diaphragm 108 receives the ultrasound and oscillates, the change of capacitance different from that of the diaphragm 109 is generated in the diaphragm 108. When a circuit detects the total of the changes of capacitances of the diaphragms 108 and 109, the reception characteristic is degraded. The third embodiment has a configuration in which the reception characteristic is not affected by the oscillation of the diaphragm 108.

FIG. 4A shows the configuration of the third embodiment. All second electrodes (lower electrodes) 105 in the element are connected to the circuit that detects the change of capacitance caused by the oscillation of the ultrasound. On the other hand, a first electrode (upper electrode) 102 existing on the diaphragm 108 is connected to the second electrode 105 through the line 113. Therefore, since no potential difference is generated between the first electrode and the second electrode in the cell on the electric connection portion 111, the change of capacitance is not detected even if the diaphragm 108 oscillates. On the other hand, all the first electrodes 102 existing on the diaphragm 109 except the diaphragm 108 are connected in the element by the lines 114, and the desired potential difference is applied between the first electrode and the second electrode.

In the cell except the cell having the diaphragm 108, the use of the configuration of the third embodiment can detect the oscillation of only the diaphragm 109 except the diaphragm 108, which is generated by the ultrasound, as the change of capacitance by applying the desired potential difference between the electrodes. According to the third embodiment, the diaphragm with which the electric connection portion is covered and the diaphragm that is used to receive the ultrasound can optimally be set. Therefore, the high-performance capacitive electromechanical transducer having the optimum reception characteristic that is hardly degraded by the ultrasound intruding into the substrate can be provided.

A modification of the third embodiment will be described with reference to FIG. 4B. The modification of the third embodiment differs from the third embodiment in the configuration of the first electrode (upper electrode) 102 on the diaphragm 108. In the modification, the first electrode 102 is not formed on the diaphragm 108. Because the electrode that pairs with the second electrode (lower electrode) 105 does not exist on the electric connection portion 111, the change of capacitance is not detected even if the diaphragm 108 oscillates. In the modification, because the first electrode 102 that is unnecessary except when the received signal is taken out does not exist in the diaphragm 108, the diaphragm 108 on the electric connection portion 111 can be formed into the optimum shape in order to cover the electric connection portion 111.

Fourth Embodiment

In a fourth embodiment, a diaphragm 101 on an electric connection portion 111 connected to the line of a first electrode (upper electrode) 102 will be described with reference to FIG. 5. Other configurations of the fourth embodiment are identical to those of one of the first to third embodiments.

In the CMUT, the desired potential is applied to the first electrode 102 in order to generate the potential difference between the first electrode and the second electrode. In the configuration of the fourth embodiment, the potential is applied to the first electrode 102 through a through line 117 formed in a first substrate 106. The first electrode 102 and the through line 117 for the first electrode 102 on the CMUT formation surface of the first substrate 106 are connected through a line 116. The through line 117 for the first electrode 102 on the CMUT non-formation surface of the first substrate 106 is connected to a corresponding line (not illustrated) on a second substrate 112 through an electric connection portion for the first electrode 102 (second electric connection portion) 118.

When the configuration of the fourth embodiment is used, even if the second electric connection portion 118 is disposed for the purpose of the first electrode (upper electrode) 102, the diaphragm exists so as to cover the second electric connection portion 118 therewith, and the amount of ultrasound reaching the electric connection portion 118 for the first electrode 102 can significantly be decreased. Therefore, even if the first electrode 102 is drawn to the CMUT non-formation surface of the first substrate 106 through the through line 117, the reception characteristic that is hardly degraded by the ultrasound intruding into the substrate can be obtained.

Fifth Embodiment

In a fifth embodiment, an electric connection portion 119 that is not connected to a through line 107 will be described with reference to FIG. 6. Other configurations of the fifth embodiment are identical to those of one of the first to fourth embodiments. A capacitive electromechanical transducer of the fifth embodiment includes the electric connection portion 119 that is not connected to the through line 107 in addition to an electric connection portion 111 that is connected to the through line 107.

The electric connection portion 119 is not connected to the through line 107 of a first substrate 106, and the electric connection portion 119 is not used to take out the received signal of the ultrasound or to apply the desired potential to the first electrode (upper electrode) 102. The electric connection portion 119 is disposed in order to retain the mechanical strength between the first substrate 106 and a second substrate 112. Even if the electric connection portions 111 and 119 have small volumes, the plural electric connection portions 119 are disposed in addition to the electric connection portion 111, which allows the whole mechanical strength to be enhanced without increasing the number of processes during preparation.

Although the electric connection portion 119 is not connected to the through line 107, the ultrasound is reflected by the electric connection portion 119 when the ultrasound intruding into the first substrate 106 reaches the electric connection portion 119, thereby degrading the reception characteristic. In the configuration of the fifth embodiment, with respect to a thickness direction of the first substrate 106, the electric connection portion 119 that is not connected to the through line 107 is also covered with the diaphragm 101. Even if the electric connection portion 119 that is not connected to the through line 107 is used, the amount of ultrasound that intrudes into the substrate and reaches the electric connection portion 111 can significantly be decreased. Therefore, even if the electric connection portion 119 is used, the reception characteristic that is hardly degraded by the ultrasound intruding into the substrate can be obtained.

Sixth Embodiment

Figure 7:
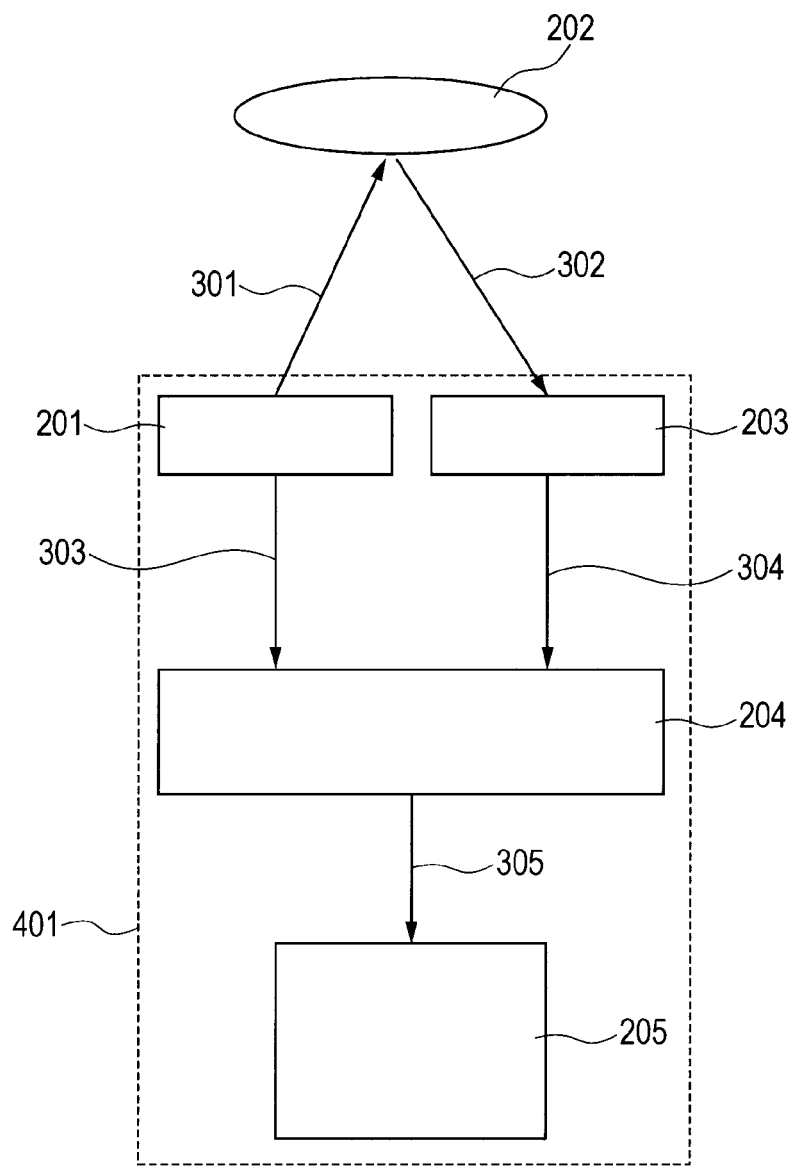
FIG. 7 is a view illustrating a capacitive electromechanical transducer according to a sixth embodiment.

In a sixth embodiment, an ultrasound measuring apparatus in which the capacitive electromechanical transducer described in one of the first to fifth embodiments is used will be described with reference to FIG. 7. In FIG. 7, reference numerals 201, 202, 203, 204, and 205 show an ultrasound transmitter (elastic wave transmitter), a measurement target, a capacitive electromechanical transducer, an image information generation apparatus, and an image display, respectively. Reference numerals 301 and 302 show ultrasound, and reference numerals 303, 304, 305, and 401 show ultrasound transmission information, an ultrasound reception signal, reproduced image information, and an ultrasound measuring apparatus, respectively.

The ultrasound 301 output from the ultrasound transmitter 201 toward the measurement target 202 is reflected on the surface of the measurement target 202 due to the difference between the characteristic acoustic impedances at the interface. The reflected ultrasound 302 is received by the capacitive electromechanical transducer 203, and pieces of information on the size and shape of the received signal and the time are transmitted as the ultrasound reception signal 304 to the image information generation apparatus 204. On the other hand, pieces of information on the size and shape of the transmitted ultrasound and the time are transmitted as the ultrasound transmission information 303 from the ultrasound transmitter 201 to the image information generation apparatus 204. In the image information generation apparatus 204, an image signal of the measurement target 202 is generated based on the ultrasound reception signal 304 and the ultrasound transmission information 303, transmitted as the reproduced image information 305, and displayed on the image display 205.

In the capacitive electromechanical transducer 203 of the sixth embodiment, the CMUT described in one of the first to fifth embodiments is used. Even if the reflected ultrasound 302 intrudes into the substrate of the CMUT, because the reception characteristic is hardly affected by the reflected ultrasound 302, the ultrasound reception signal 304 that is hardly degraded can be output. Therefore, because the information on the ultrasound 302 reflected by the measurement target 202 can more correctly be obtained, the image of the measurement target 202 can more correctly be reproduced. The ultrasound transmitter 201 may include the capacitive electromechanical transducer of the invention, or one capacitive electromechanical transducer may be used to transmit and receive the ultrasound.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-245847, filed Nov. 2, 2010, which is hereby incorporated by reference herein in its entirety.

What is claimed is:

1. A capacitive electromechanical transducer comprising:
   a first substrate;
   a first diaphragm configured to oscillate by receiving an ultrasound;
   a first electrode on the first diaphragm;

a second electrode that is disposed on a first surface side of the first substrate, wherein the ultrasound is detected based on a change of capacitance between the first electrode and the second electrode;

a through line that is electrically connected to the second electrode and penetrates the first substrate; and a first electric connection portion that is provided on a second surface side of the first substrate, the first and second surfaces being opposite surfaces of the first substrate, and electrically connected to the through line, wherein the first diaphragm is provided so as to interpose a cavity between the first diaphragm and the second electrode, and wherein the first diaphragm covers the through line and the first electric connection portion with respect to a thickness direction of the first substrate so as to reduce the ultrasound traveling to the through line and the first electric connection portion.

2. The capacitive electromechanical transducer according to claim 1, further comprising;

a second electric connection portion that is provided on the second surface side and is electrically connected to the first electrode; and a second diaphragm that is provided so as to interpose a cavity between the second diaphragm and the first substrate and covers the second electric connection portion.

3. The capacitive electromechanical transducer according to claim 1, wherein the first electric connection portion is electrically connected to a line on a second substrate that is disposed as facing the second surface of the first substrate to form a space between the first substrate and the second substrate.

4. The capacitive electromechanical transducer according to claim 3, wherein an inter-substrate filling substance is disposed in an area where the first electric connection portion is not in the space disposed between the first substrate and the second substrate.

5. The capacitive electromechanical transducer according to claim 3, wherein an ultrasound damping substance is disposed on a surface in which the first electric connection portion is not disposed on the second substrate.

6. The capacitive electromechanical transducer according to claim 1, wherein a size of the first electric connection portion with respect to a size of the first diaphragm is defined by an angle θ0 at which the ultrasound is incident to the first substrate by the following expression, $$a > b + t \times \tan(\sin^{-1}(C2/C1 \times \sin(\theta 0)))$$

where "a" is the size of the first diaphragm, "b" is the size of the first electric connection portion, "t" is a thickness of the first substrate, C1 is a sound velocity in a substance through which the ultrasound travels, and C2 is a sound velocity in the first substrate.

7. The capacitive electromechanical transducer according to claim 1, wherein a size of the first electric connection portion is defined by an incident angle to the first substrate with respect to a size of the first diaphragm by the following expression, $$a > b + t \times \tan(\sin^{-1}(C2/C1 \times \sin(\theta \max)))$$

where "a" is the size of the first diaphragm, "b" is the size of the first electric connection portion, "t" is a thickness of the first substrate, C1 is a sound velocity in a substance through which the ultrasound travels, C2 is a sound velocity in the first substrate, and θmax is a maximum incident angle at which the ultrasound is used in the first substrate defined in consideration of a reception characteristics.

8. The capacitive electromechanical transducer according to claim 1, wherein the first electric connection portion is larger than the through line with respect to an area as viewed from a direction normal to the first surface of the first substrate.

9. The capacitive electromechanical transducer according to claim 1, wherein the reception of an ultrasound causes a capacitance change between the first electrode and the second electrode and the capacitance change causes an output of electric current from one of the first and second electrodes.

10. The capacitive electromechanical transducer according to claim 1, wherein the first substrate has a through-hole, and
wherein the through-hole is filled with the through line.

11. The capacitive electromechanical transducer according to claim 1, wherein the through line includes copper.

12. A measurement apparatus comprising:
a capacitive electromechanical transducer; and
an image information generation apparatus that generates image information on a measurement target using at least a signal received from the capacitive electromechanical transducer, wherein the capacitive electromechanical transducer comprises:

a first substrate;
a first diaphragm configured to oscillate by receiving an ultrasound;
a first electrode on the first diaphragm;
a second electrode that is disposed on a first surface side of the first substrate, wherein the ultrasound is detected based on a change of capacitance between the first electrode and the second electrode;
a through line that is electrically connected to the second electrode and penetrates the first substrate; and
a first electric connection portion that is provided on a second surface side of the first substrate, the first and second surfaces being opposite surfaces of the first substrate, and electrically connected to the through line,
wherein the first diaphragm is provided so as to interpose a cavity between the first diaphragm and the second electrode, and
wherein the first diaphragm covers the through line and the first electric connection portion with respect to a thickness direction of the first substrate so as to reduce the ultrasound traveling to the through line and the first electric connection portion.

13. A capacitive electromechanical transducer, comprising:
a first substrate;
a first diaphragm configured to oscillate by receiving an ultrasound;
a first electrode on the first diaphragm;
a second diaphragm configured to oscillate by receiving the ultrasound;
a second electrode that is disposed on a first surface side of the first substrate, wherein the ultrasound is detected based on a change of capacitance between the first electrode and the second electrode;
a through line that is electrically connected to the second electrode and penetrates the first substrate; and
a first electric connection portion that is provided on a second surface side of the first substrate, the first and second surfaces being opposite surfaces of the first substrate, and electrically connected to the through line, wherein the first diaphragm is provided so as to interpose a cavity between the first diaphragm and the second electrode, and wherein the second diaphragm is provided so as to interpose a cavity between the second diaphragm and the second electrode, and covers the through line and the first electric connection portion with respect to a thickness direction of the first substrate so as to reduce the ultrasound traveling to the through line and the first electric connection portion.

14. The capacitive electromechanical transducer according to claim 13, wherein the first diaphragm does not cover the first electric connection portion, and wherein a size of the first diaphragm differs from a size of the second diaphragm.

15. The capacitive electromechanical transducer according to claim 13, wherein the first electric connection portion is larger than the through line with respect to an area as viewed from a direction normal to the first surface of the first substrate.

16. The capacitive electromechanical transducer according to claim 13, wherein the reception of an ultrasound causes a capacitance change between the first electrode and the second electrode and the capacitance change causes an output of electric current from one of the first and second electrodes.

* * * * *